(12) United States Patent
Eriksson et al.

(10) Patent No.: US 6,169,500 B1
(45) Date of Patent: Jan. 2, 2001

(54) SERIAL-PARALLEL AND PARALLEL-SERIAL CONVERTER

(75) Inventors: Anders Eriksson, Umeå; Lars-Olof Svensson, Lund, both of (SE)

(73) Assignee: Telefonaktiebolaget LM Ericsson (publ), Stockholm (SE)

( * ) Notice: Under 35 U.S.C. 154(b), the term of this patent shall be extended for 0 days.

(21) Appl. No.: 09/202,615

(22) PCT Filed: Jun. 4, 1997

(86) PCT No.: PCT/SE97/00980

§ 371 Date: Sep. 23, 1999

§ 102(e) Date: Sep. 23, 1999

(87) PCT Pub. No.: WO97/49186

PCT Pub. Date: Dec. 24, 1997

(30) Foreign Application Priority Data

Jun. 20, 1996 (SE) .................................................. 9602458

(51) Int. Cl.[7] .................................................. H03M 9/00
(52) U.S. Cl. ............................................ 341/100; 341/101
(58) Field of Search .................................... 341/100, 101

(56) References Cited

U.S. PATENT DOCUMENTS

| 4,429,300 | * | 1/1984 | Yamasawa et al. | 341/100 |
| 5,163,092 | * | 11/1992 | McNesby et al. | 380/28 |
| 5,367,300 | * | 11/1994 | Fong et al. | 341/101 |
| 5,774,079 | * | 6/1998 | Zirngibl | 341/100 |
| 5,926,120 | * | 7/1999 | Swenson et al. | 341/100 |

FOREIGN PATENT DOCUMENTS

| 42 14 612 | 11/1993 | (DE) . |
| 0 346 896 | 12/1989 | (EP) . |
| 0 397 198 | 11/1990 | (EP) . |
| 0 479 296 | 4/1992 | (EP) . |
| WO96/05658 | 2/1996 | (WO) . |

* cited by examiner

Primary Examiner—Peguy Jean Pierre
(74) Attorney, Agent, or Firm—Burns, Doane, Swecker & Mathis, L.L.P.

(57) ABSTRACT

The invention relates to fast serial-parallel and parallel-serial converters, and in them included frequency dividers. The serial-parallel converter comprises a shift register, an output register and a frequency divider. The parallel-serial converter comprises a register and a frequency divider. All registers and frequency dividers comprise clock inputs, that each is connected to some incoming clock signal. According to the invention, the frequency divider comprises at least two circuits with the function of AND-gates with clocked memory circuits. Each circuit comprises a clock input, a first AND-input, a second AND-input, and at least one output that outputs the value of the logical AND-function of the two AND-inputs. The first AND-inputs are connected to each other and to an inverted signal from one of the outputs. The second AND-inputs except on the first circuit are connected to the output of the preceding circuit. Finally a frequency divided clock signal may be taken out from one of the outputs.

18 Claims, 6 Drawing Sheets

SERIAL-PARALLEL AND PARALLEL-SERIAL CONVERTER

FIELD OF INVENTION

The present invention relates to a fast serial-parallel converter and parallel-serial converter and frequency dividers included therein.

BACKGROUND ART

There is described in European Patent Application EP 479 296 A1 a serial-parallel converter that comprises a shift register which includes four D-flip-flops, an output register that includes four D-flip-flops, and a frequency divider that includes two D-flip-flops and an inverter. The frequency divider is coupled as a shift register, with the Q-output on the second D-flip-flop that is fed-back to the D-input of the first D-flip-flop via the inverter. The shift register and the frequency divider are clocked by an incoming clock, whereas the output register is clocked by a frequency divided signal taken out from the Q-output of the second D-flip-flop.

Serial data signals are taken into the D-input of the first D-flip-flop of the shift register, taken out from the Q-outputs of the shift register every fourth clock cycle, and fed-out as parallel data signals on the Q-outputs of the output register.

SUMMARY OF THE INVENTION

An object of the present invention is to provide a frequency divider comprised of circuits that have the function of AND-gates with clocked memory circuits.

Another object of the present invention is to provide a fast and inexpensive frequency divider for use in converters, for instance.

A third object of the present invention is to provide a frequency divider which in addition to a frequency divided signal is also capable of producing a pulse signal.

A fourth object of the present invention is to provide a serial-parallel converter that is fast, inexpensive and uses the least possible different types of circuit A fifth object of the present invention is to provide a parallel-serial converter that is fast, inexpensive and uses the least possible number of different types of circuit.

A sixth object of the present invention is to provide a high-speed block in which serial-parallel and parallel-serial conversion can both take place.

One problem with earlier known serial-parallel and parallel-serial converters is the difficulty in producing fast converters in a simple and cost-effective manner.

The present invention solves this problem by virtue of a construction with which each output is coupled to few inputs, therewith reducing the delays in the circuits. In distinction, incoming data signals are delayed in relation to incoming clock signals (or vice versa), so as to clock the data signals in the middle of the data. This reduces the error risk.

In one embodiment of the frequency divider it is utilized that different inputs have different input capacitances, so as to enable the delays in the circuits to be reduced by giving the inputs other uses than normal. With the intention of reducing the cost of the construction, solely so-called scan flip-flops are used, i.e. D-flip-flops with multiplexed inputs, and inverters and buffers.

One advantage afforded by the present invention is that the construction enables the serial-parallel converters and parallel-serial converters to be made faster than was earlier the case.

Another advantage afforded by the invention is that the frequency divider can also be used in other connections than converters.

DETAILED DESCRIPTION OF PREFERRED EMBODIMENTS

Figures 1A, 1B:
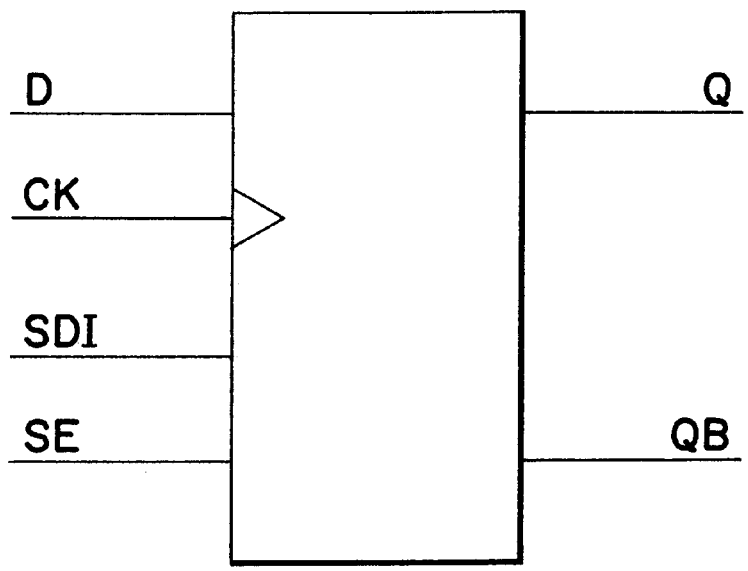
FIG. 1a shows a circuit symbol denoting a scan flip-flop.
FIG. 1b shows a function table for a scan flip-flop.

So-called scan flip-flops can be used when practicing the invention, i.e. D-flip-flops having multiplexed inputs, such as CMDF02 or CMDF03 marketed by Motorola. FIG. 1a shows a scan flip-flop. The illustrated flip-flop has four inputs: data input D, clock input CK, scan input SDI and scan enable input SE. The flip-flop also has two outputs: output Q and inverted output QB. The scan enable input controls what is clocked out on the outputs Q and QB according to:

$$Q = SE * SDI + \overline{SE} * D$$

$$QB = \overline{Q}$$

In order for the scan flip-flops to operate as fast as possible, the number of inputs connected to one and the same output should be reduced, i.e. the so-called fanout on the output. It can be mentioned by way of example that in the Motorola CMDF02 a fanout of 0 gives a delay of 0.739 ns when changing from low to high on output Q, whereas a fanout of 8 in the corresponding case gives a delay of fully 1.065 ns. This phenomenon is because all inputs and outputs and connections therebetween have a capacitance. One of the concepts of the present invention is to increase speed by providing a low fanout on all outputs.

Described hereinafter is an embodiment in which one byte contains nine bits. All variants ranging from two bits and upwards are possible. The bits will be numbered [8:0] where bit 8 is the most significant bit (MSB) and bit 0 is the least significant bit (LSB) In order to avoid numbering all inputs and outputs on the scan flip-flops in the drawings, in the following it will apply for instance, that scan flip-flop 2 has output $Q_2$ and data input $D_2$, and so on, with reference to FIG. 2 and FIG. 1a.

Frequency divider

Figure 2:
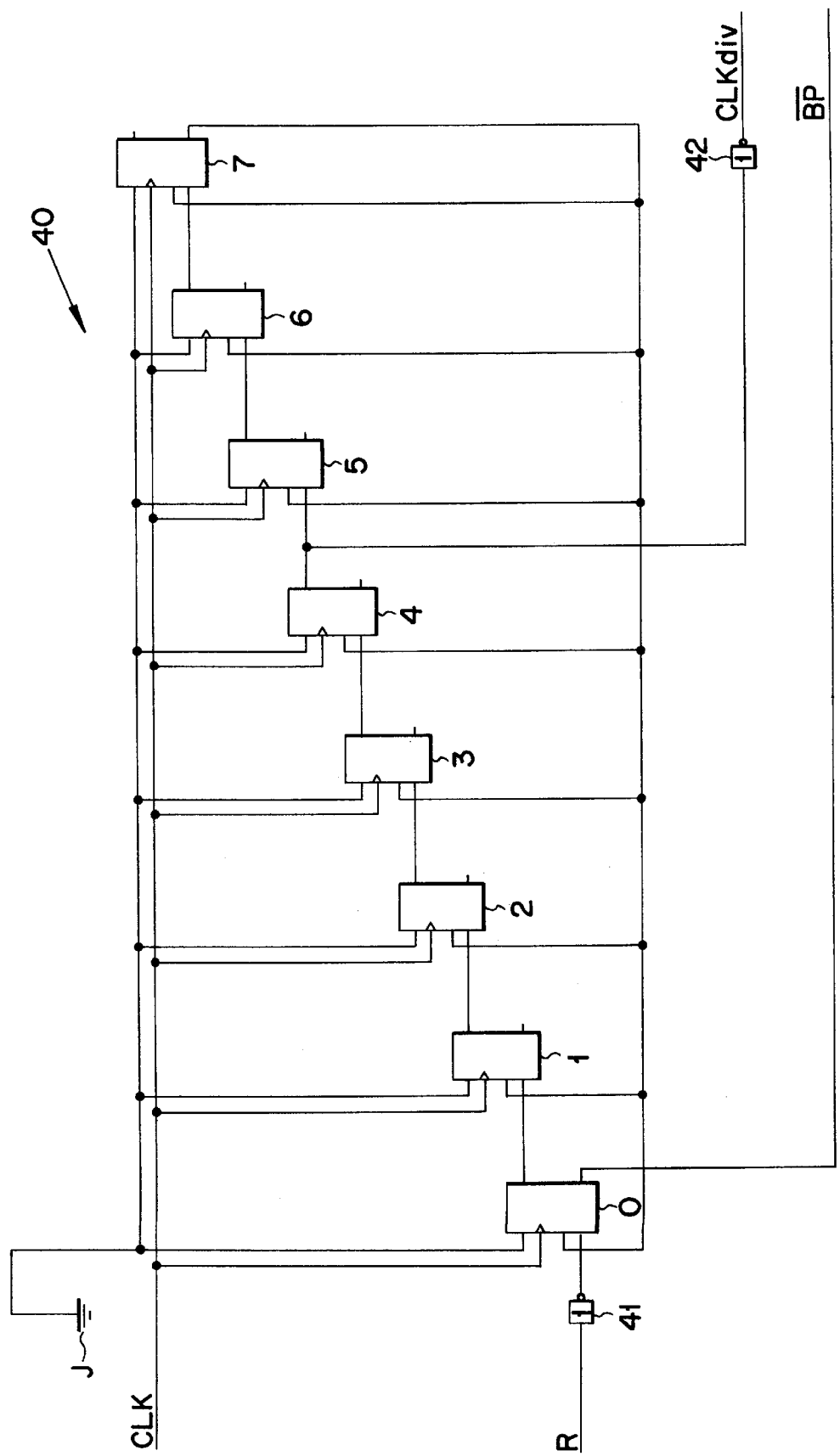
FIG. 2 is a circuit layout of a frequency converter.

FIG. 2 illustrates one embodiment of a frequency divider 40. In order to divide the frequency of an incoming clock signal CLK by nine, so as to form an outgoing clock signal CLKdiv, there are used eight scan flip-flops 0–7 that am connected in a shift register-like manner. The incoming clock signals CLK is coupled to the clock inputs $CK_a$ of all scan flip-flops (a=0–7, corresponding to bits 0–7). With the intention of optimizing speed, earth J is connected to all data inputs $D_a$. The outputs $Q_a$ will thus obtain the appearance:

$$Q_a = SE_a * SDI_a$$

The inputs $SE_a$ and $SDI_a$ are thus exchangeable, which is beneficial in view of the fact that the input capacitance of the scan enable input SE is higher than the input capacitance of the scan input SDI. Thus, when several scan enable inputs SE are connected to one and the same output, the delay will be greater than if the same number of scan inputs SDI had been connected to the same output The scan enable inputs $SE_a$ in the frequency divider 40 can thus be used functionally, which is made possible because the outputs $Q_a$ of each scan flip-flop, with the exception of the last scan flip-flop 7, are connected to the scan enable input $SE_{a+1}$ of the next-following scan flip-flop. Furthermore, all scan inputs $SDI_a$ are connected together with the inverse output $QB_7$ of the last scan flip-flop 7.

Figure 5:
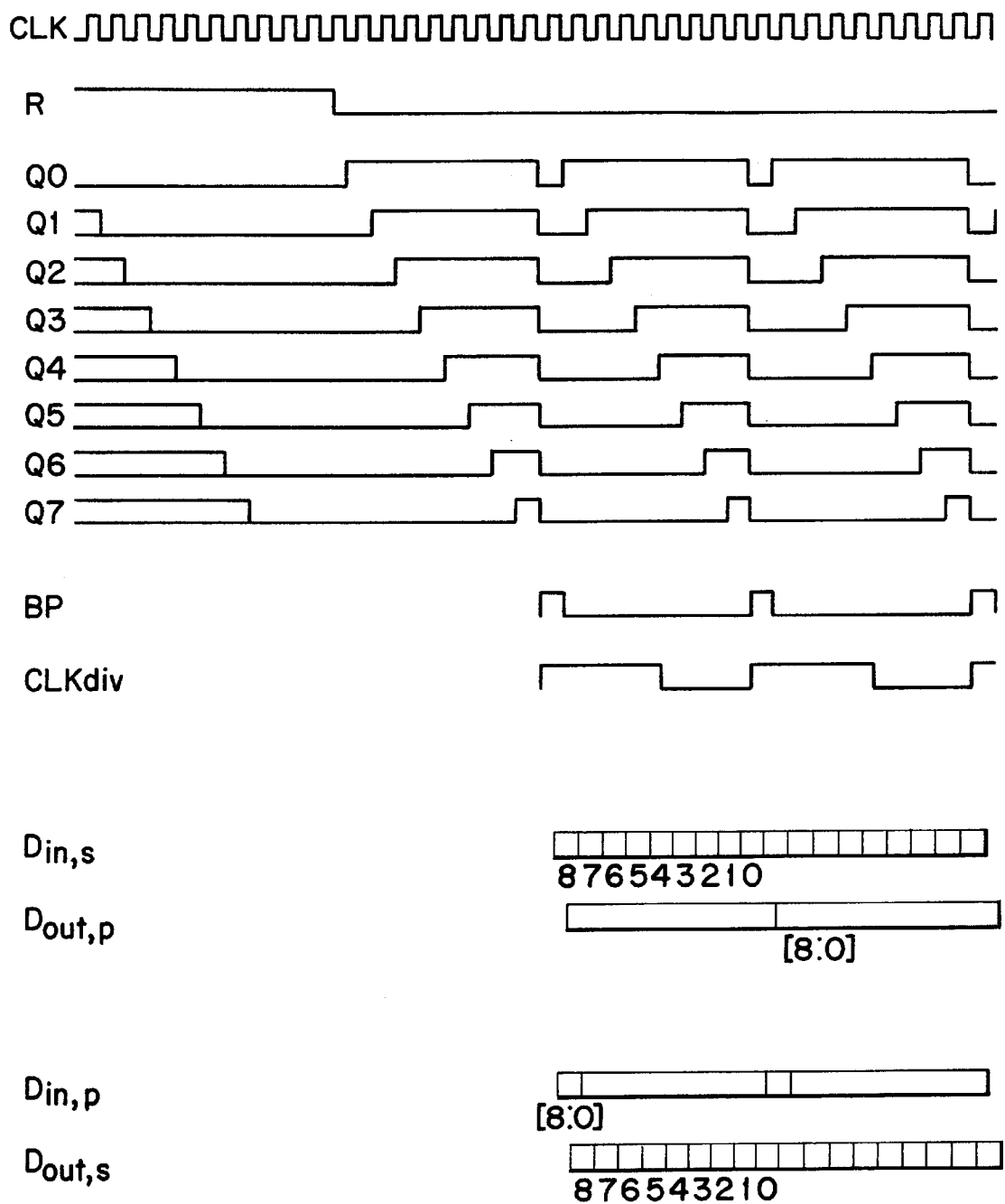
FIG. 5 is a time diagram of events in FIGS. 2–4.

When the frequency divider 40 functions normally, the following sequence in hexadecimal base is obtained on the output $Q_a$ [7:0]: 00, 01, 03, 07, 0F, 1F, 3F, 7F, FF, 00 . . . , see FIG. 5. If it is desired to be able to set the frequency divider 40 to zero, a reset signal R is applied on the free or unoccupied scan enable input $SE_1$ of the first scan flip-flop, conveniently via an inverter 41. If the inverter 41 is used and the reset signal R is kept high for at least eight clock cycles, the whole of the frequency divider 40 will be zeroed, as is also shown in FIG. 5.

Because the frequency of the incoming clock signal CLK is divided by nine, the outgoing clock signal CLKdiv may have one of two configurations: The pulse quotient will be either 44% or 55% (pulse quotient being defined as the time during which the signal is high divided by the cycle time). A pulse quotient of 55% is chosen in the illustrated case, since the unbalanced driving capability between N- and P-transistors will work against a lower pulse quotient when the outgoing clock signal CLKdiv is used. The outgoing clock signal CLKdiv is therefore taken out from scan flip-flop 4, either from output $Q_4$ via an inverter 42, as in FIG. 2, or directly from the inverted output $QB_4$. In this latter case, it may be necessary to couple-in a buffer if the clock signal CLKdiv is to be used by many circuits. Otherwise, there is a risk of loading down the frequency divider 40, causing it to become slower.

If the frequency divider 40 is to be used to control a serial-parallel converter or a parallel-serial converter, a pulse BP is required. This pulse may be taken out from the first scan flip-flop 0, either from output $Q_0$ or, as preferred, (shown in FIG. 2) from the inverted output $QB_0$ via at least one inverter 43 (see FIGS. 3 or 4).

A suitable frequency of an incoming clock signal may be 184.32 MHz, which gives an outgoing clock signal of 20.48 MHz. Trials have shown that higher speeds are possible. However, it is suitable to provide a safety margin so as not to lose data.

In the aforedescribed example, the scan multiplexor in the scan flip-flops is used as a kind of AND-gates with clocked memory circuits. It will be understood, however, that other circuits that have the same function may be used instead, providing that attention is paid to how much or how little the signal is delayed in the circuits when the frequency divider shall be used in one of the converters described below, for instance.

Serial-parallel converter

Figure 3:
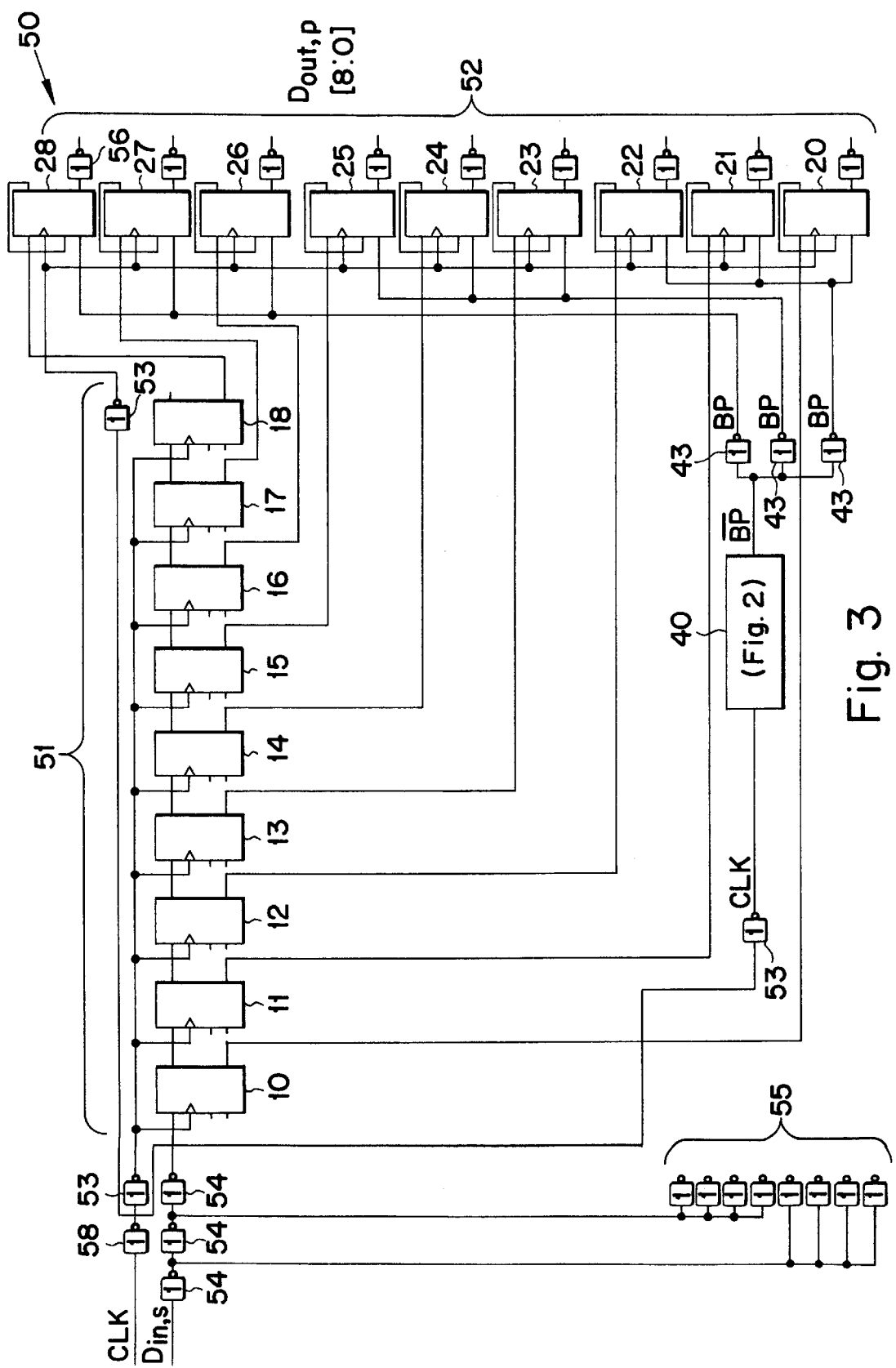
FIG. 3 is a circuit layout of a serial-parallel converter.

A typical occasion when a frequency divider is required is in serial-parallel converters. It may be appropriate to use as few types of circuits as possible in order to optimize design. FIG. 3 illustrates an embodiment of a serial-parallel converter 50 in which solely scan flip-flops and inverters are used.

The frequency divider used is the aforedescribed frequency divider 40. A shift register 51 is also used to receive incoming serial data signals $D_{in,s}$ and an output register 52 for sending output parallel data signals $D_{out,p}$.

An incoming clock signal CLK is connected commonly to the frequency divider 40, the shift register 51 and the output register 52. In order to speed-up the clocking process, the clock signal is buffered with three parallel connected inverters 53: one to the frequency divider 40, one to the shift register 51 and one to the output register 52.

The shift register 51 is an almost conventional nine-bit shift register with output $Q_b$ (b=10–18, corresponding to the bits 0–8) on each scan flip-flop, with the exception of the last scan flip-flop 18, connected to the data input $D_{b+1}$ on the following scan flip-flop, and clocked with the incoming clock signal CLK coupled to all clock inputs $CK_b$. However, the difference between the shift register 51 and a typical shift register is that the parallel signals $D_{out,p}$ are taken out from the inverted outputs $QB_b$, so as to reduce fanout on the outputs. Because the multiplexing part of the scan flip-flops 10–18 is not used, conventional D-flip-flops may also be used in this respect.

It is beneficial to clock the data signals somewhere in the middle of the data. This is particularly important at high speeds, since data could otherwise be lost. In order to optimize clocking, the incoming data signal $D_{in,s}$ is delayed in relation to the incoming clock signal CLK, by buffering the signals to different extents. In the illustrated case, the incoming clock signal CLK is buffered with two inverters 58, 53 (see also the above comments), while the incoming data signal is buffered with three inverters 54. Good optimization can be obtained with a load 55 of inverters connected in parallel with the shift register input $D_{10}$. This enables the delay of the incoming data signals $D_{in,s}$ in relation to the incoming clock signal CLK to be finely adjusted with the aid of the size of the load 55. Alternatively, there can be used a solution similar to that described below with reference to the parallel-serial converter.

The output register 52 includes nine scan flip-flops 20–28. The data inputs $D_c$ (where c=20–28, corresponding to the bits 0–8) are each coupled to a respective inverted output $QB_b$ (b=c–10) on the shift register 51. The clock inputs $CK_c$ are coupled to the incoming clock signal CLK and are buffered to the same extent as the clock inputs $CK_b$ of the shift register. The outputs $Q_c$ on each scan flip-flop 20–28 in the output register 52 are fed back to the scan input $SDI_c$.

A pulse signal BP is taken in on the scan enable inputs $SE_c$ from the frequency divider 40. The pulse signal BP will suitably be buffered by at least two parallel-connected inverters, so as to reduce fanout. FIG. 3 shows an example that includes three inverters 43.

The output register 52 functions so that $Q_c$ will be equal to $SDI_c$ during eight clock cycles. A pulse BP appears on the scan enable input $SE_c$ in the ninth clock cycle, making $Q_c$ equal to $D_c$.

The entire serial-parallel converter 50 functions so that serial data signals $D_{in,s}$ are clocked into the shift register 51 one bit/clock cycle, see FIG. 5. The shift register 51 contains a new byte at each ninth clock cycle. This byte is clocked in on the output register 52 and a parallel data signal $D_{out,p}$ is taken out at a speed which corresponds to one-ninth of the speed of the incoming data signals $D_{in,s}$.

Although it is sometimes possible to use buffers instead of inverters, buffers often delay signals more than inverters, which makes it necessary to make calculations so that the different signals will not be in the wrong phase relative to one another. Naturally, it is also necessary to consider that the buffers do not invert.

It has been assumed in the aforegoing that one byte includes nine bits. All bit numbers from two and upwards are possible.

Parallel-serial converter

Figure 4:
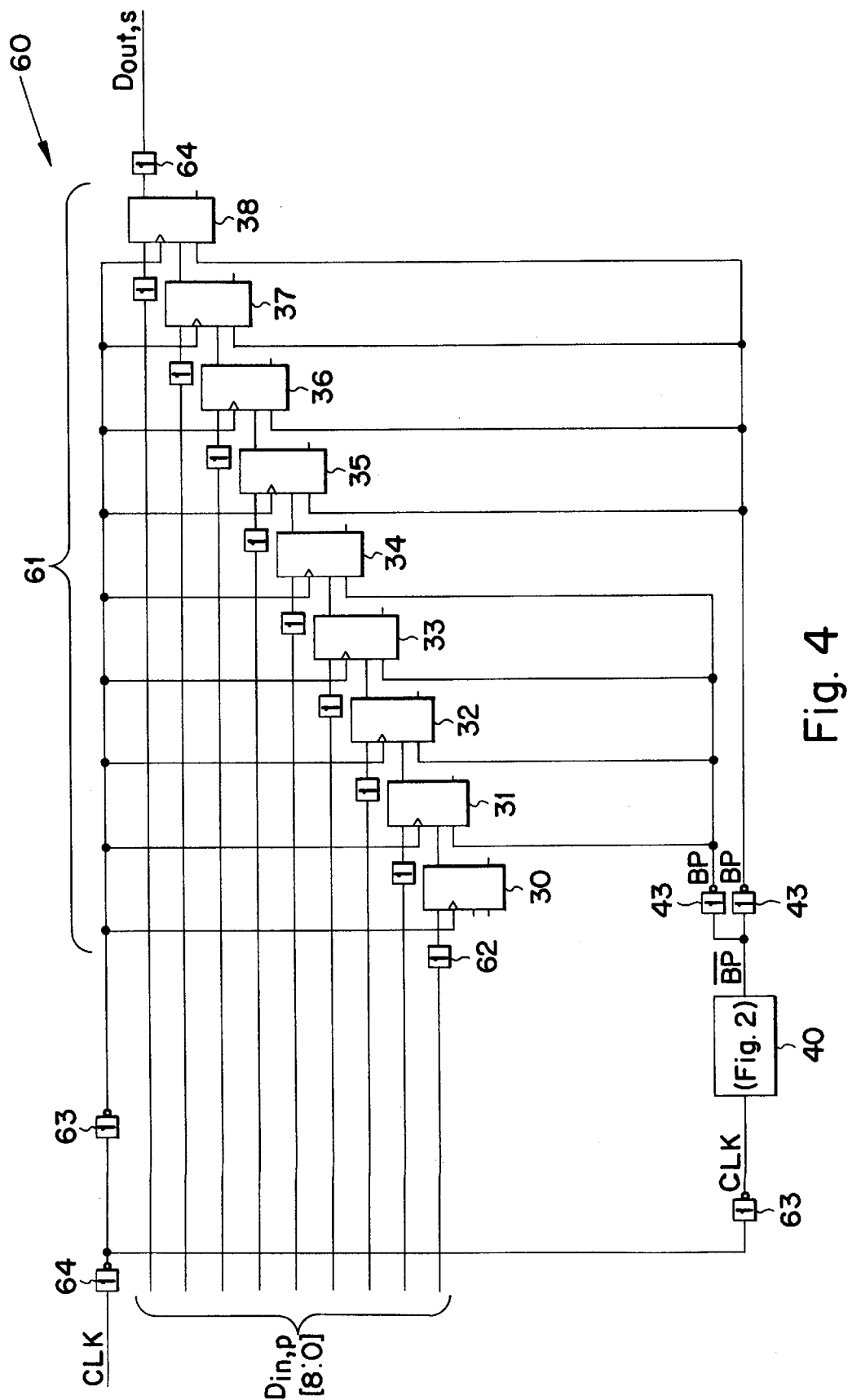
FIG. 4 is a circuit layout of a parallel-serial converter.

Frequency dividers are also required in parallel-serial converters. It may be suitable also in this case to use as few types of circuits as possible, so as to optimize design. FIG. 4 illustrates an embodiment of a parallel-serial converter 60 with which only scan flip-flops, inverters and buffers are used.

The aforedescribed frequency divider 40 is used as the frequency divider in this embodiment. In addition, there is used a register 61 for receiving incoming parallel data signals $D_{in,p}$ and for sending outgoing serial data signals $D_{out,s}$.

An incoming clock signal CLK is coupled commonly to the frequency divider 40 and the register 61. In order to speed-up clocking, the clock signal CLK is buffered with two parallel-connected inverters 63: one to the frequency divider 40 and one to the register 61.

The register 61 is a shift register-like coupling with nine scan flip-flops 30–38. The parallel data signals $D_{in,p}$ are taken in on the data inputs $D_d$ (d=30–38, corresponding to the bits 0–8) and the incoming clock signal CLK is coupled to the clock inputs $CK_d$ of the scan flip-flops. The output $Q_d$ on each scan flip-flop, with the exception of the last scan flip-flop 38, is coupled to the scan input $SDI_{d+1}$ on the subsequent scan flip-flop. The serial data signals $D_{out,s}$ are taken out from the output $Q_{38}$ on the last scan flip-flop 38, optionally via a buffer 64.

As in the case of the serial-parallel converter 50, it is beneficial to clock the data signals somewhere in the middle of the data. This is particularly advantageous at high speeds, since data could otherwise be lost. A solution similar to that applied in the serial-parallel converter 50 can also be applied in this case. Another good alternative (see FIG. 4) is to delay the incoming clock signal CLK in relation to the incoming data signal $D_{in,p}$, by buffering the signals to mutually different extents. In the illustrated embodiment, the incoming clock signal CLK is buffered with two inverters 64, 63 (see also the above comments), while the incoming data signal $D_{in,p}$ is buffered with a buffer 62. Because the extent to which a buffer delays is greater than the extent to which an inverter delays, the desired effect is achieved.

The conversion is controlled with the aid of a pulse signal BP that arrives from the frequency divider 40 and that is connected to the scan enable inputs $SE_d$ on all scan flip-flops, with the exception of the first. It is suitable to buffer the pulse signal BP via at least two parallel-connected inverters, precisely as in the case of the serial-parallel converter 50. FIG. 4 shows an example with two inverters 43.

The register 61 functions so that $Q_d=SDI_d$ during eight clock cycles. A pulse BP occurs on the scan enable input $SE_d$ during the ninth clock cycle, resulting in $Q_d=D_d$.

The entire parallel-serial converter 60 thus functions so that new parallel data $D_{in,p}$ enters the register 61 via the data inputs $D_d$ at each ninth clock cycle, see FIG. 5. The data signals are shifted through the register 61 during the following eight cycles, and out through output $Q_{38}$ on the last scan flip-flop 38 as serial data signals $D_{out,s}$. The speed of the serial data signals $D_{out,s}$ will then be nine times greater than the speed of the parallel data signals $D_{in,p}$. Those possibilities and the caution that must be applied in respect of the change between inverters and buffers referred to in the description of the serial-parallel converter also apply in the case of the parallel-serial converter.

It has been assumed in the example that one byte includes nine bits. All bit numbers from two and upwards are possible.

High-speed block

Figure 6:
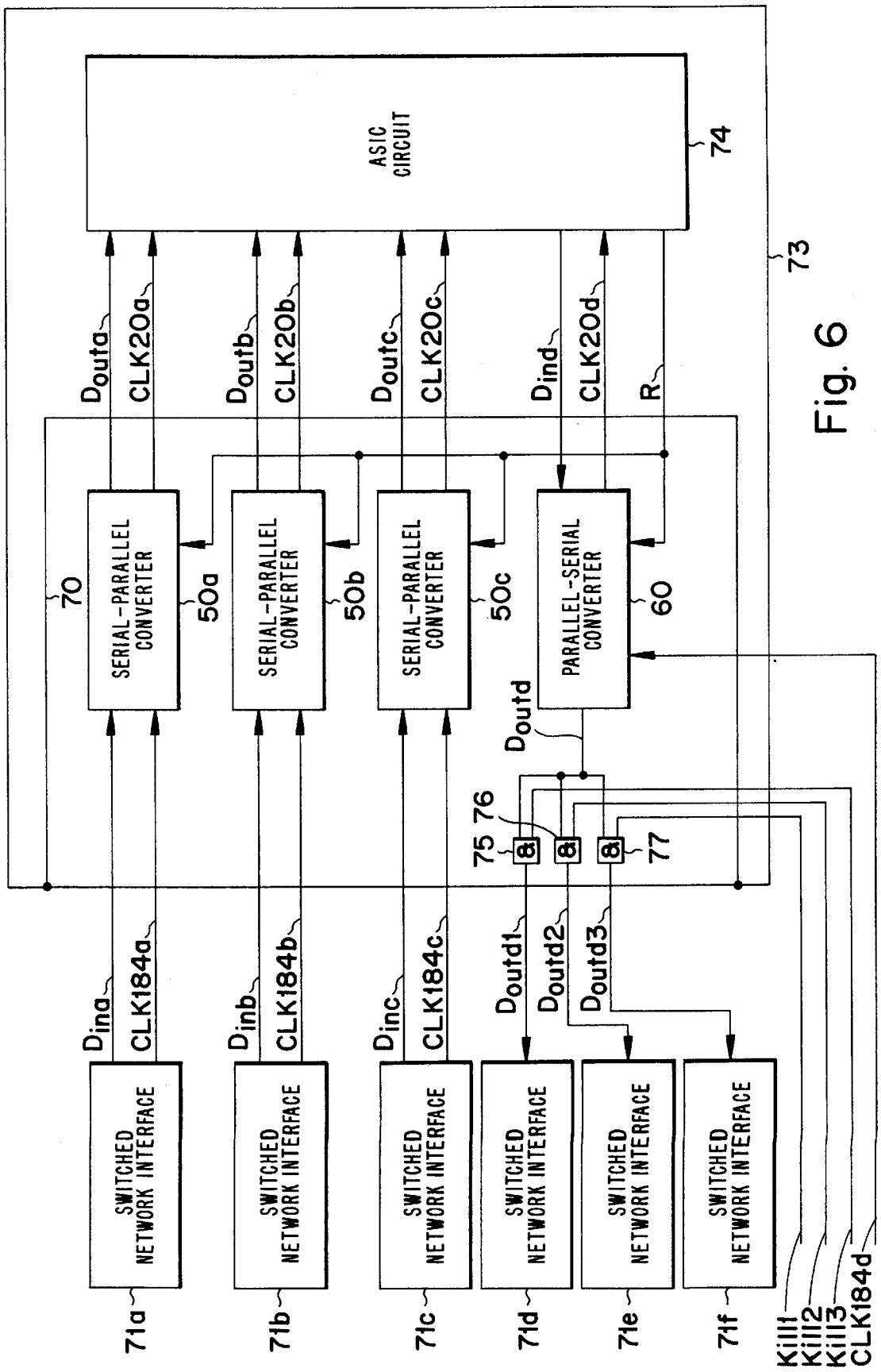
FIG. 6 is a block schematic illustrating a high-speed block that contains serial-parallel and parallel-serial converters.

FIG. 6 shows how the serial-parallel and parallel-serial converters can be applied.

One effective manner of transmitting data signals between boards in a system is via SN14-interfaces (Switch Network Interface) 71a–71f with a data transfer rate of 184 Mbit/s. This data transfer rate, however, is not practical for use within an integrated circuit, such as an ASIC-circuit 73 (Application Specific Integrated Circuit). The solution is to break down the incoming serial data signals $D_{ina}$–$D_{inc}$ to nine-bit parallel data signals $D_{outa}$–$D_{outc}$ and generate a 20 MHz clock signal CLK20a–CLK 20d to the remainder of the ASIC-circuit 74, by dividing the incoming clock signal CLK184a–CLK184d by nine. A corresponding process then takes place in the other direction; an outgoing 9-bit parallel data signal $D_{ind}$ is converted to an outgoing serial data signal $D_{outd}$.

These functions are handled by a high-speed block 70. In the illustrated embodiment, this block includes one parallel-serial converter 60 and three serial-parallel converters 50a–50c, and thus handles an outgoing SN14-channel $D_{outd}$ and three incoming SD14-channels $D_{ina}$–$D_{inc}$. The outgoing SN14-channel $D_{outd}$ is divided into three different branches $D_{outd1}$–$D_{outd3}$ that can be inhibited individually, i.e. maintained at a constant low level by passing each branch $D_{outd1}$–$D_{outd3}$ through an AND-gate 75–77 to which an inhibiting signal Kill1–Kill3 is applied. When the inhibiting signal Kill1–Kill3 is high, the signals pass from the outgoing SN14-channel $D_{outd}$ through the AND-gate 75–77 with no trouble, but the output on the AND-gate 75–77 is set to zero by the inhibiting signal Kill1–Kill3 is low.

It is, of course, most suitable in practice for the inhibiting signal Kill1–Kill3 to function as actively low, i.e. with an inverter upstream of the input.

In order to ensure that the converters 50a–c, 60 operate simultaneously, it is possible to zero-set the frequency division in all converters 50a–c, 60 simultaneously with the aid of a reset signal R controlled from the remainder of the ASIC circuit 74.

This high-speed block can then be varied as required by input signals and output signals, and in accordance with desired speeds.

What is claimed is:

1. A frequency divider for use in a serial-parallel or parallel-serial converter for dividing a frequency of an incoming clock signal, said frequency divider including clock inputs coupled to the incoming clock signal, said frequency divider comprising:

at least two circuits that perform the function of AND-gates with clocked memory circuits, each of said at least two circuits comprises:
a clock input,
a first AND-input,
a second AND-input, and
a plurality of outputs, at least one of which outputs a value of the logical AND-function of the first and second AND-inputs;

wherein the first AND-inputs are connected to each other and to an inverted signal from a last one of the plurality of outputs, the second AND-inputs, except on a first of said at least two circuits, are connected together and to an output of another circuit that performs the function of an AND-gate, and a frequency divided clock signal is taken out from a second one of the plurality of outputs.

2. A frequency divider according to claim 1, wherein
said at least two circuits are D-flip-flops with multiplexed inputs, said D-flip-flops each including a data input, a scan input, a clock input, a scan enable input, an output that outputs a value from the data input or the scan input, depending on a value of the scan enable input, and an inverse output;
the data inputs are kept low;
the scan inputs correspond to the first AND-inputs that are connected to each other and to one of the inverse outputs; and
the scan enable inputs correspond to the second AND-inputs.

3. A frequency divider according to claim 1, wherein a pulse signal is taken out from a third one of the plurality of outputs.

4. A frequency divider according to claim 1, wherein the frequency divider can be zeroed with the aid of a reset signal that arrives on the second AND-gate on the first of said at least two circuits.

5. A serial-parallel converter that includes a shift register having clock inputs connected to an incoming clock signal and having an input for incoming serial data signals, and an output register having clock inputs connected to the incoming clock signal, having outputs for outputting parallel data signals, and having inputs that are connected together and to outputs of the shift register, said serial-parallel converter comprising:
a frequency divider having clock inputs connected to the incoming clock signal that is connected to the shift-register clock inputs, said frequency divider outputting a control signal which controls when data signals from the shift register shall be clocked in to the output register, the frequency divider comprises:
at least two circuits that perform the function of AND-gates with clocked memory circuits, each of said at least two circuits comprises:
a clock input,
a first AND-input,
a second AND-input, and
a plurality of outputs, at least one of which outputs a value of the logic AND-function of the first and second AND-inputs;
wherein
the first AND-inputs are connected together and to an inverted signal from a last one of the plurality of outputs,
the second AND-inputs, except on a first of said at least two circuits, are connected together and to an output of another circuit that performs the function of an AND-gate, and
a frequency divided clock signal is taken out from a second one of the plurality of outputs.

6. A serial-parallel converter according to claim 5, wherein the converter includes D-flip-flops with multiplexed inputs, each of said D-flip-flops including a data input, a scan input, a clock input, a scan enable input, an output that outputs a value from the data input or the scan input, depending on a value of the scan enable input, and an inverse output;
data inputs in the frequency divider are kept low;
scan inputs in the frequency divider correspond to the first AND-inputs, which are connected to each other and to one of the inverse outputs in the frequency divider; and
scan enable inputs in the frequency divider correspond to the second AND-inputs.

7. A serial-parallel converter according to claim 6, wherein the incoming clock signal and the incoming serial data signals are buffered with inverters or buffers, so as to clock the data signals essentially midway in the data.

8. A serial-parallel converter according to claim 7, wherein an additional load is connected in parallel with the input of the shift register to enable a delay difference between the incoming clock signal and the incoming serial data signals to be finely adjusted.

9. A serial-parallel converter according to claim 8, wherein said load comprises two groups that include four inverters mutually connected in parallel.

10. A serial-parallel converter according to claim 6, wherein
the outputs of the output register are fed back to respective scan inputs;
the clock inputs of the output register are connected to the same incoming clock signal as the clock inputs of the shift register and the frequency divider; and
the control signal is a pulse signal which is applied to scan enable inputs of the output register.

11. A serial-parallel converter according to claim 6, wherein inverted parallel data signals are taken out from inverse outputs of the output register.

12. A serial-parallel converter according to claim 6, wherein the data signals that are taken out from the shift register are taken out from inverse outputs of said shift register.

13. A serial-parallel converter according to claim 6, wherein the control signal is buffered with at least two parallel-coupled inverters or buffers.

14. A parallel-serial converter that includes a register with clock inputs coupled to an incoming clock signal and having inputs for inputting parallel data signals, and at least one output for outputting serial data signals, said parallel-serial converter comprising:
a frequency divider having clock inputs coupled to the incoming clock signal, said frequency divider outputting a control signal which controls when new parallel data signals shall be taken into the register, the frequency divider comprises:
at least two circuits that function as AND-gates with clocked memory circuits, each of said circuits comprises:
a clock input,
a first AND-input,
a second AND-input, and
a plurality of outputs, at least one of which outputs a value of the logic AND-function of the first and second AND-inputs;
wherein
the first AND-inputs are connected to each other and to an inverted signal from a one of the plurality of outputs;
the second AND-inputs, except on a first of said at least two circuits, are connected to an output of another circuit that performs the function of an AND-gate; and
a frequency divided clock signal is taken out from a second one of the plurality of outputs.

15. A parallel-serial converter according to claim 14, wherein the register includes D-flip-flops with multiplexed inputs, each of said D-flip-flops including a data input, a scan input, a clock input, a scan enable input, an output that outputs a value from the data input or from the scan input, depending on a value of the scan enable input, and an inverse output;
the data inputs in the frequency divider are kept low;

scan inputs in the frequency divider correspond to the first AND-inputs that are connected to each other and to an inverse output in the frequency divider; and scan enable inputs in the frequency divider correspond to the second AND-inputs.

16. A parallel-serial converter according to claim 14, wherein the incoming clock signal and the incoming parallel data signals are buffered with inverters or with buffers, so that the parallel data signals are clocked essentially midway in the data.

17. A parallel-serial converter according to claim 14, wherein the control signal is a pulse signal which is buffered with at least two parallel connected inverters or buffers, and which is connected to scan enable inputs of the register.

18. A high speed block that functions as an interface between high transfer speed signals and low transfer speed signals and that includes at least one parallel-serial converter and at least one serial-parallel converter, wherein the serial-parallel converter comprises:

a frequency divider having clock inputs connected to an incoming clock signal that is connected to a shift-register clock input, said frequency divider outputting a control signal which controls when data signals from the shift-register shall be clocked into the output register, the frequency divider comprising:
at least two circuits that form the function of AND-gates with clocked memory circuits, each of said at least two circuits comprising:
a clock input,
a first AND-input,
a second AND-input, and
a plurality of outputs, at least one of which outputs a value of the logic AND-function of the first and second AND-inputs;

wherein
the first AND-inputs are connected to each other and to an inverted signal from a last one of the plurality of outputs;
the second AND-inputs, except on the first of said at least two circuits, are connected to an output of another circuit that performs the function of an AND-gate; and
a frequency divided clock signal that is taken out from a second one of the plurality of outputs;
and wherein the parallel-serial converter comprises:
a frequency divider having clock inputs coupled to an incoming clock signal, said frequency divider outputting a control signal which controls when new parallel data signals shall be taken into the register, the frequency divider comprising:
at least two circuits that function as AND-gates with clock memory circuits, each of said circuits comprising:
a clock input,
a first AND-input,
a second AND-input, and
a plurality of outputs, at least one of which outputs a value of the logic AND-function of the first and second inputs:
wherein the first AND-inputs are connected to each other and to an inverted signal from a last one of the plurality of outputs;
the second AND-inputs, except on the first of said at least two circuits, are connected to an output of another circuit that performs the function of an AND-gate; and
a frequency divided clock signal that is taken out from a second one of the plurality of outputs.

* * * * *